United States Patent [19] [11] 4,179,797
Johnson [45] Dec. 25, 1979

[54] METHOD OF MAKING A RESISTOR ARRAY

[75] Inventor: Wendell C. Johnson, Topanga, Calif.
[73] Assignee: Xerox Corporation, Stamford, Conn.

[21] Appl. No.: 889,796
[22] Filed: Mar. 23, 1978
[51] Int. Cl.$^2$ .................. H01L 21/84; H01C 1/034; H01C 17/02
[52] U.S. Cl. .................. 29/610 R; 29/613; 338/260; 338/320
[58] Field of Search .................. 29/610 R, 613, 620, 29/610; 338/195, 320, 260

[56] References Cited

U.S. PATENT DOCUMENTS

| | | | |
|---|---|---|---|
| 2,994,846 | 8/1961 | Quinn | 338/308 |
| 4,082,572 | 4/1978 | Anthony | 29/610 R |

*Primary Examiner*—Francis S. Husar
*Assistant Examiner*—Gene P. Crosby
*Attorney, Agent, or Firm*—Leonard Zalman

[57] ABSTRACT

A resistor array formed by the process of forming a plurality of holes or grooves in an electrically insulating substrate, filling the holes or grooves completely with a flowable, electrical resistance material, and then hardening the resistance material. The resistance material can be comprised of an electrically non-conductive thermally setting base material throughout which electrically conductive particles are dispersed, or the resistance material can be colloidal or a suspension. The value of the resistors is determined by the volume resistance of the resistance material and the volume of the holes or grooves, the resistance increasing as the length of the holes or grooves increases and decreasing as the cross-sectional area of the holes or grooves increases. A resistor array having leadless terminals is provided by sandwiching the insulating substrate between layers of electrically conductive material and forming the holes or grooves through at least one of the layers of electrically conductive material and the substrate, and then filling the holes or grooves with the resistance material.

3 Claims, 5 Drawing Figures

METHOD OF MAKING A RESISTOR ARRAY

BACKGROUND OF THE INVENTION

With the increasing attention now being given to the micro-miniaturization of electronic circuitry, efficient fabrication of miniaturized electrical components, such as resistors and resistor assemblies or arrays, has taken on new importance. One prior art method of making thin film resistor assemblies (U.S. Pat. No. 2,994,846) is initiated by coating the inner surfaces of holes made in a suitable substrate with a thin titanium film. The titanium film is then converted into a high resistivity film by anodizing the film in a bath essentially consisting of an anodizing electrolyte and an etching material capable of etching the metal oxide formed on the titanium film as a result of anodization thereof. The concentration of etching material in the bath is chosen so that the surface of the film is converted into an oxide by anodization before being attacked by the etching material, the time of simultaneous anodizing and etching in the bath determining the resultant resistivity of the film. In a preferred embodiment of the simultaneous anodizing-etching process, a two-bath treatment is provided in which the first bath performs the sinultaneous anodizing and etching of the film as described above until an intermediate resistivity is obtained, then the final value of resistance is obtained in a second bath containing an anodizing material but no etching material. This second bath is chosen so that the anodizing process penetrates to a greater depth than did the anodizing process of the first bath, thereby causing a greater portion of the titanium film to be converted to oxide to increase the resistivity of the film.

The value of the resistors made by the described anodizing-etching process depends upon several factors, namely, (1) the surface area of the holes supporting the titanium, (2) the uniformity of the thickness of the film of titanium deposited on the surfaces of the holes, and (3) the portion of the titanium film converted to an oxide. The second factor, that is, film uniformity, is difficult to control especially when the aspect ratio of the holes, that is, the width to depth ratio of the holes, is large. Film uniformity is especially difficult to control when the film is depositd by an electrolysis deposition, since such a deposition tends to form thicker coatings at the edges of the holes. The third factor, that is, the portion of the film oxidized, is also believed hard to control and sophisticated monitoring apparatus is believed to be required to control what portion of the film is oxidized.

OBJECTS OF THE INVENTION

It is an object of the present invention to provide an improved method of making miniature electronic components.

It is a further object of the present invention to provide an improved method of making miniature electrical components inexpensively.

It is a further object of the present invention to provide an improved method of making resistors and resistor arrays.

It is a further object of the present invention to provide a method of making resistors and resistor arrays having controllable electrical resistance and leadless terminal connections.

It is a still further object of the present invention to provide an improved method of making miniature electronic components that lends itself well to mass production techniques.

SUMMARY OF THE INVENTION

In accordance with the invention, electrical resistors and resistor arrays are made by a process consisting of the steps of forming a plurality of holes or grooves in a suitable electrically insulating substrate, filling those holes or grooves completely with a flowable electrical resistance material and then hardening the resistance material. The value of the resistors is determined by the volume resistance of the resistance material and the volume of the holes or grooves, the resistance increasing as the length of the holes or grooves increases and decreasing as the cross-sectional area of the holes or grooves increases. Preferably, the resistance material is comprised of an electrically non-conductive, thermally setting base material throughout which are dispersed electrically conductive particles. Colloidals or suspensions of materials can also be utilized as the resistance material. To provide a resistor array having leadless terminals, the substrate is sandwiches between layers of electrically conductive material with the holes or grooves in this case being formed through at least one of the layers of electrically conductive material and the substrate, to thereby provide electrical contact to both sides of the resistors when the holes or grooves are filled with the resistance material.

DETAILED DESCRIPTION OF THE INVENTION

Figure 1:
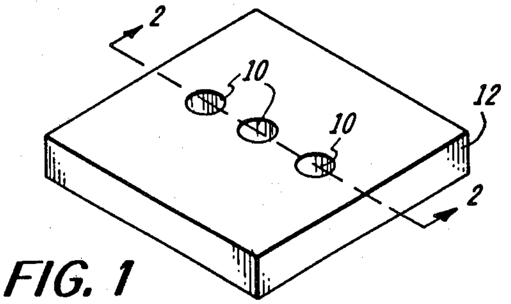
FIGS. 1 and 3 are schematic illustrations of steps in the resistor array making process of the invention.
Figure 2:
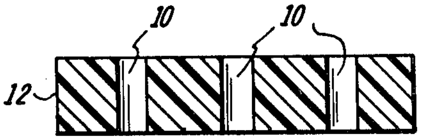
FIG. 2 is a cross-sectional view of FIG. 1 taken along line 2—2.
Figure 3:
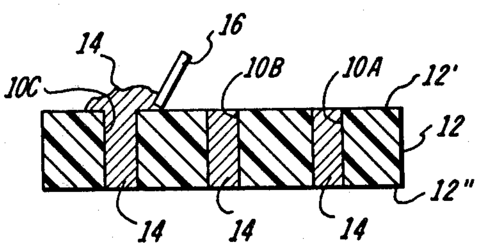

Referring now to FIGS. 1-3, which exemplify the process of the invention, a plurality of holes 10 are formed in an electrically insulating substrate 12 which may be any of a variety of suitable materials such as, for example, fused silica, quartz, glass, alumina, and magnesium oxide. Holes 10 are preferably circular, although other configurations are contemplated, and preferably are formed by drilling through, or otherwise boring or etching through, the substrate 12. The holes 10 may be of uniform size or alternatively may be of different sizes, with the size (diameter) of each hole and its depth (the thickness of substrate 12) being contributing factors to the value of the resistor formed at the hole location.

The holes 10 are now filled with a flowable, resistance material, as shown in FIG. 3 where holes 10*a* and 10*b* have been filled with flowable, resistance material 14 and hole 10*c* is in the process of being filled with resistance material 14. The manner in which the holes 10 are filled is not critical provided that the holes are completely filled with resistance material 14 and that no air pockets are left within the holes 10. For example, holes 10 can be filled by depositing a volume of the resistance material 14 on a surface 12′ of the substrate 12 and forcing the resistance material 14 into the holes by moving a doctor blade 16 or othe squeegee-type device over the surface 12′, as shown in FIG. 3. Excess resistance material is then removed from the upper and lower surfaces 12' and 12" of substrate 12, as by wiping or scrubbing those surfaces. In order to promote flow of the resistance material 14 into holes 10, the substrate 12 can be vibrated at a low frequency, for example, 5 cycles per second, as the doctor blade 16 is drawn across th surface 12'. In lieu of the doctor blade-type deposition, the holes 10 can be filled by placing the substrate 12 with holes 10 therein in a closed chamber (not shown) and forcing resistance material 14 onto the chamber under pressure (as is done in injection molding processes) such that the resistance material 14 is forced into the holes, followed by wiping or scrubbing the substrate surfaces to remove excess surface resistance material. In lieu of holes or grooves, other depressions, crevices or voids can be provided in or through the substrate 12 to accept the resistance material 14.

Resistance material 14 can be comprised of a base material which is flowable, thermal setting, and electrically non-conducting and throughout which is dispersed electrically conductive particles. For example, the base material can be a thermal setting plastic in resin form, such as, for example, a phenolic resin, a polyester resin, or epoxy, or any other flowable material which can be set or hardened by heating or other means. In this exemplary resistance material, the base material is doped uniformly with electrically conductive particles. The dopent particles preferably are spheres of a base metal such as silver or copper, although the particles may have other shapes and can be of other material such as, for example, carbon and titanium dioxide. The size of the particles and their density are selected to provide resistance material 14 with a desired volume resistance. Preferably, the diameter of the particles is between one and fifty (50) mcirons and the particles are provided in quantity such as to provide the resistance material with a volume resistance between $10^{10}$ and $10^{-2}$ ohms per cubic centimeter of the resistance material, although other size particles and other volume resistances may be utilized if desired.

Figure 4:
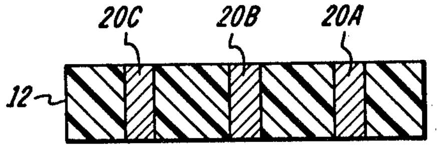
FIG. 4 is a cross-sectional view of a resistor array made by the process of the invention.

After the holes 10 are completely filled with resistance material 14, resistance material 14 is set by heating, for example, to provide columnar resistors **20*a*, 20*b* and 20*c*, as shown in FIG. 4. When the base material of the resistance material 14 is a phenolic resin, setting of the resin can be achieved by heating the substrate 12 with the resistance material 14 in holes 10** for ten to sixty minutes at 300 C. The time and temperature required to set other suitable base materials will be known to those skilled in the art.

The resistance material has been described in the exemplary method as a particulate material. Material 14 need not be particulate but instead may be colloidal or a suspension.

The determination of the resistance value of each of the columnar resistors 20 of the resistor assembly is evident from the following considerations. First, as a result of the simultaneous fabrication of each of the resistors 20, it will be realized that the volume resistance of all the resistors 20 are the same, with a difference in resistance value between resistors **20*a*, 20*b* and 20*c* being determined by the diameter and length of the hole 10 defining each individual resistor. That is, the relative value of resistors 20 is detrmined by appropriately choosing the diameter of each resistor in proper relation to the diameter of each other resistor (assuming that each hole is the same length). Since the diameter of the holes 10 is the only factor (other than the volume resistance of resistance material 14** and hole length) determing resistor values, it is apparent that the disclosed process provides resistors and resistor arrays of a value or values limited only by hole making criteria and not by oxide conversion and oxide etching criteria. Hence, since the hole making process can be very closely controlled, the process of the invention will produce resistors and resistor arrays having desired values and uniformity.

Figure 5:
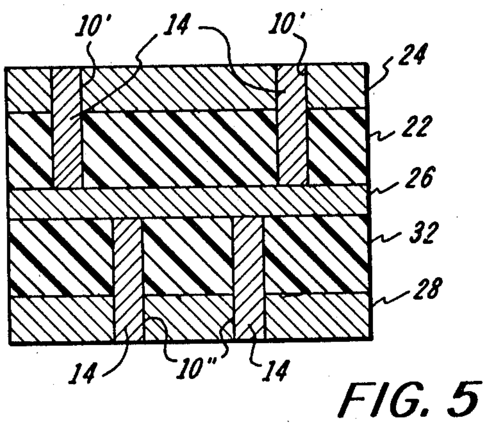
FIG. 5 is a cross-sectional view of a resistor array having leadless terminal connections.

In a further embodiment of the invention which provides leadless connections to the resistors as shown in FIG. 5, first and second electrically non-conductive layers 22 and 32 of substrate material, as described in relation to FIGS. 1–4, are sandwiched between electrically conductive layers 24, 26 and 28, for example, of copper. Holes 10' are provided through the layers 24 and 22 and holes 10" are provided through layers 28 and 32 so that the holes 10' and 10" reach layer 26. The holes 10' and 10" are now filled with the resistance material 14 as previously described. It is evident that the resistor elements of FIG. 5 make contact with layer 26 and with one of the other conductive layers 24 and 28 to provide electrical connections for the resistor elements. Since these electrical connections are leadless terminal connections, they provide interfacial continuity with the resistor elements and as such provide a minimum of impedance mismatch and therefore a minimum of insertion losses.

What is claimed is:

1. A process of making a resistor array comprising the steps of:

providing a plurality of voids in a substrate of electrically non-conductive material, filling the voids completely with a flowable resistance material, said resistance material having a resistivity less than the resistivity of said material of said substrate, and hardening said resistance material to thereby provide resistors within said substrate.

2. A process of making a resistor array having leadless contacts comprising the steps of:

providing a layer of electrically insulating material sandwiched between layers of electrically conductive material, forming a plurality of holes in said layered structure, said holes extending through only one of said electrically conductive layers and completely through said layer of electrically insulating material, filling said holes completely with a flowable resistance material, and hardening said resistance material to thereby provide within said substrate resistors having leadless connections to said layers of electrically conductive material.

3. A process of making a resistor array comprising the steps of:

providing a plurality of holes in a substrate of electrically non-conductive material, said holes extending from one surface of said substrate to an opposed surface of said substrate, filling said holes completely with a flowable resistance material, said resistance material having a resistivity less than the resistivity of said material of said substrate, and hardening said resistance material to thereby provide high resistance regions within said substrate.

* * * * *